US008242776B2

(12) United States Patent  
Mather et al.

(10) Patent No.: US 8,242,776 B2  
(45) Date of Patent: Aug. 14, 2012

(54) MAGNETIC SENSOR DESIGN FOR SUPPRESSION OF BARKHAUSEN NOISE

(75) Inventors: Phillip G. Mather, Maricopa, AZ (US); Young Sir Chung, Chandler, AZ (US); Bradley N. Engel, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 987 days.

(21) Appl. No.: 12/055,482

(22) Filed: Mar. 26, 2008

(65) Prior Publication Data

US 2009/0243607 A1 Oct. 1, 2009

(51) Int. Cl.  
*G01R 33/02* (2006.01)

(52) U.S. Cl. ............. 324/249; 324/225; 324/207.21; 324/252; 324/247; 324/244; 324/260; 324/262; 324/245; 338/32 R; 360/324.2; 428/811

(58) Field of Classification Search .......... 324/225, 324/207.21, 249, 297.21, 252, 247, 244, 324/260, 262, 245; 338/32 R; 360/324.2; 428/811

See application file for complete search history.

(56) References Cited

U.S. PATENT DOCUMENTS

| | | | |
|---|---|---|---|
| 5,247,278 A | | 9/1993 | Pant et al. |
| 5,650,721 A | * | 7/1997 | van den Berg et al. .. 324/207.21 |
| 5,650,958 A | * | 7/1997 | Gallagher et al. ............ 365/173 |
| 5,695,864 A | * | 12/1997 | Slonczewski ................. 428/212 |
| 5,945,825 A | * | 8/1999 | Clemens ...................... 324/252 |
| 5,953,248 A | * | 9/1999 | Chen et al. ................... 365/158 |
| 5,982,660 A | * | 11/1999 | Bhattacharyya et al. ..... 365/173 |
| 6,023,395 A | * | 2/2000 | Dill et al. .................. 360/324.2 |
| 6,075,361 A | * | 6/2000 | Coehoorn et al. ............ 324/252 |
| 6,084,405 A | * | 7/2000 | Suzuki ......................... 324/252 |
| 6,130,814 A | * | 10/2000 | Sun ............................. 361/143 |
| 6,259,586 B1 | | 7/2001 | Gill |
| 6,324,029 B1 | | 11/2001 | Matsubara et al. |
| 6,331,773 B1 | * | 12/2001 | Engel ........................... 324/252 |
| 6,501,678 B1 | * | 12/2002 | Lenssen et al. ............... 365/173 |
| 6,640,652 B2 | * | 11/2003 | Kikuchi et al. ........... 73/862.333 |
| 6,771,472 B1 | * | 8/2004 | Mao et al. .................... 360/314 |
| 6,937,497 B1 | * | 8/2005 | Ju et al. ........................ 365/130 |
| 6,963,779 B1 | | 11/2005 | Shankar |

(Continued)

FOREIGN PATENT DOCUMENTS

EP 0950871 A2 10/1999

(Continued)

OTHER PUBLICATIONS

PCT Search Report for PCT/US2009/038448 mailed Nov. 24, 2009.

(Continued)

*Primary Examiner* — Patrick Assouad  
*Assistant Examiner* — Lamarr Brown  
(74) *Attorney, Agent, or Firm* — Ingrassia Fisher & Lorenz, P.C.

(57) ABSTRACT

A semiconductor process and apparatus provide a high-performance magnetic field sensor from two differential sensor configurations (201, 211) which require only two distinct pinning axes (206, 216), where each differential sensor (e.g., 201) is formed from a Wheatstone bridge structure with four unshielded MTJ sensors (202-205), each of which includes a magnetic field pulse generator (e.g., 414) for selectively applying a field pulse to stabilize or restore the easy axis magnetization of the sense layers (e.g., 411) to eliminate micromagnetic domain switches during measurements of small magnetic fields.

8 Claims, 6 Drawing Sheets

U.S. PATENT DOCUMENTS

| | | | |
|---|---|---|---|
| 6,970,379 B2 * | 11/2005 | Parkin | 365/173 |
| 7,034,651 B2 * | 4/2006 | Bohlinger | 338/100 |
| 7,054,114 B2 | 5/2006 | Jander et al. | |
| 7,102,918 B2 * | 9/2006 | Smith et al. | 365/158 |
| 7,170,173 B2 * | 1/2007 | Leuschner et al. | 257/758 |
| 7,170,724 B2 | 1/2007 | Sato et al. | |
| 7,172,904 B2 | 2/2007 | Engel et al. | |
| 7,176,679 B2 * | 2/2007 | Baragatti et al. | 324/252 |
| 7,187,167 B2 * | 3/2007 | Sato et al. | 324/244 |
| 7,220,602 B2 * | 5/2007 | Chung et al. | 438/3 |
| 7,271,587 B2 * | 9/2007 | Withanawasam | 324/252 |
| 7,352,613 B2 * | 4/2008 | Ho et al. | 365/158 |
| 7,414,396 B2 * | 8/2008 | Chung et al. | 324/244 |
| 7,444,738 B2 * | 11/2008 | Chung et al. | 29/603.13 |
| 7,541,804 B2 * | 6/2009 | Chung et al. | 324/244 |
| 7,547,480 B2 * | 6/2009 | Chung et al. | 428/811.1 |
| 7,602,177 B2 * | 10/2009 | Butcher et al. | 324/244 |
| 7,635,974 B2 * | 12/2009 | Guo et al. | 324/207.21 |
| 7,759,933 B2 * | 7/2010 | Coillot et al. | 324/252 |
| 7,965,077 B2 * | 6/2011 | Engel et al. | 324/252 |
| 7,973,349 B2 * | 7/2011 | Huai et al. | 257/295 |
| 2001/0038927 A1 * | 11/2001 | Hasewaga | 428/692 |
| 2002/0131215 A1 * | 9/2002 | Beach | 360/324.2 |
| 2002/0172068 A1 * | 11/2002 | Hidaka | 365/100 |
| 2002/0175680 A1 * | 11/2002 | Heremans et al. | 324/252 |
| 2002/0180443 A1 * | 12/2002 | Fine et al. | 324/338 |
| 2003/0094944 A1 * | 5/2003 | Suzuki et al. | 324/252 |
| 2003/0107373 A1 * | 6/2003 | Van Zon | 324/252 |
| 2004/0032318 A1 * | 2/2004 | Mori et al. | 338/32 R |
| 2004/0137275 A1 * | 7/2004 | Jander et al. | 428/692 |
| 2004/0189294 A1 * | 9/2004 | Ishihara et al. | 324/252 |
| 2005/0025999 A1 * | 2/2005 | Gill | 428/694 TM |
| 2005/0088786 A1 | 4/2005 | Gill | |
| 2005/0168317 A1 * | 8/2005 | Clifton et al. | 338/32 R |
| 2006/0007728 A1 | 1/2006 | Sundstrom | |
| 2006/0012459 A1 * | 1/2006 | Lenssen | 338/32 R |
| 2006/0056217 A1 | 3/2006 | Takizawa et al. | |
| 2006/0127701 A1 * | 6/2006 | Ruigrok et al. | 428/811 |
| 2006/0139025 A1 * | 6/2006 | Jeffers | 324/207.21 |
| 2006/0145690 A1 * | 7/2006 | Shoji | 324/207.21 |
| 2006/0245118 A1 * | 11/2006 | Tuttle | 360/324.2 |
| 2006/0262594 A1 * | 11/2006 | Fukumoto | 365/158 |
| 2006/0267056 A1 * | 11/2006 | Ju et al. | 257/295 |
| 2006/0268469 A1 | 11/2006 | Sato et al. | |
| 2007/0022598 A1 * | 2/2007 | Chung et al. | 29/603.13 |
| 2007/0025027 A1 * | 2/2007 | Chung et al. | 360/324.2 |
| 2007/0025028 A1 * | 2/2007 | Chung et al. | 360/324.2 |
| 2007/0063695 A1 | 3/2007 | Ruhrig | |
| 2007/0076330 A1 * | 4/2007 | Chung et al. | 360/324.2 |
| 2007/0099031 A1 | 5/2007 | Chung et al. | |
| 2007/0159735 A1 * | 7/2007 | Butcher et al. | 360/324.2 |
| 2007/0281079 A1 * | 12/2007 | Carey et al. | 427/131 |
| 2007/0296406 A1 * | 12/2007 | Shin et al. | 324/207.21 |
| 2008/0055792 A1 * | 3/2008 | Zheng et al. | 360/324.2 |
| 2008/0232002 A1 * | 9/2008 | Mather et al. | 360/324.2 |
| 2009/0059444 A1 * | 3/2009 | Mather et al. | 360/324.11 |
| 2009/0102464 A1 * | 4/2009 | Doogue et al. | 324/207.21 |
| 2009/0279212 A1 * | 11/2009 | Engel et al. | 360/314 |

FOREIGN PATENT DOCUMENTS

| | | |
|---|---|---|
| WO | 9909427 A1 | 2/1999 |

OTHER PUBLICATIONS

M. J. Caruso et al., A New Perspective on Magnetic Field Sensing, Honeywell, Inc. May 1998.

Partial International Search Report mailed Jul. 31, 2009.

* cited by examiner

MAGNETIC SENSOR DESIGN FOR SUPPRESSION OF BARKHAUSEN NOISE

BACKGROUND OF THE INVENTION

1. Field of the Invention

The present invention is directed in general to the field of magnetoelectronic devices. In one aspect, the present invention relates to CMOS-compatible magnetoelectronic field sensors used to sense magnetic fields.

2. Description of the Related Art

Sensors are widely used in modern systems to measure or detect physical parameters, such as position, motion, force, acceleration, temperature, pressure, etc. While a variety of different sensor types exist for measuring these and other parameters, they all suffer from various limitations. For example, inexpensive low field sensors, such as those used in an electronic compass and other similar magnetic sensing applications, generally consist of anisotropic magnetoresistance (AMR) based devices. In order to arrive at the required sensitivity and reasonable resistances that mesh well with CMOS, the sensing units of such sensors are generally in the order of square millimeters in size. For mobile applications, such AMR sensor configurations are too costly, in terms of expense, circuit area, and power consumption.

Other types of sensors, such as magnetic tunnel junction (MTJ) sensors and giant magnetoresistance (GMR) sensors, have been used to provide smaller profile sensors, but such sensors have their own concerns, such as inadequate sensitivity and being effected by temperature changes. To address these concerns, MTJ, GMR, and AMR sensors have been employed in a Wheatstone bridge structure to increase sensitivity and to eliminate temperature dependent resistance changes. For minimal sensor size and cost, MTJ or GMR elements are preferred. Typically, a Wheatstone bridge structure uses magnetic shields to suppress the response of reference elements within the bridge so that only the sense elements (and hence the bridge) respond in a predetermined manner. However, the magnetic shields are thick and require carefully tuned NiFe seed and plating steps. Another drawback associated with magnetic shields arises when the shield retains a remnant field when exposed to a strong (~5 kOe) magnetic field, since this remnant field can impair the low field measuring capabilities of the bridge structure. To prevent the use of magnetic shields, a Wheatstone bridge structure may include two opposite anti-ferromagnetic pinning directions for each sense axis, resulting in four different pinning directions which must be individually set for each wafer, very often requiring complex and unwieldy magnetization techniques. There are additional challenges associated with using MTJ sensors to sense the earth's magnetic field, such as accounting for variations in the measured field caused by Barkhausen noise, sporadic depinning, and jumps of micromagnetic domains as the sense element responds to an applied field. Prior solutions have attempted to address these challenges by pinning the ends of the sense element in the MTJ sensor, either through a hard magnetic bias layer or an anti-ferromagnetic pinning layer, or by applying a field along the easy axis of the sense element during measurement. These solutions add processing cost/complexity and/or consume additional power during measurement.

Accordingly, a need exists for an improved sensor and method that is adaptable for measuring various physical parameters. There is also a need for a simple, rugged and reliable sensor that can be efficiently and inexpensively constructed as an integrated circuit structure for use in mobile applications. There is also a need for an improved magnetic field sensor and fabrication to overcome the problems in the art, such as outlined above. Further limitations and disadvantages of conventional sensor technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
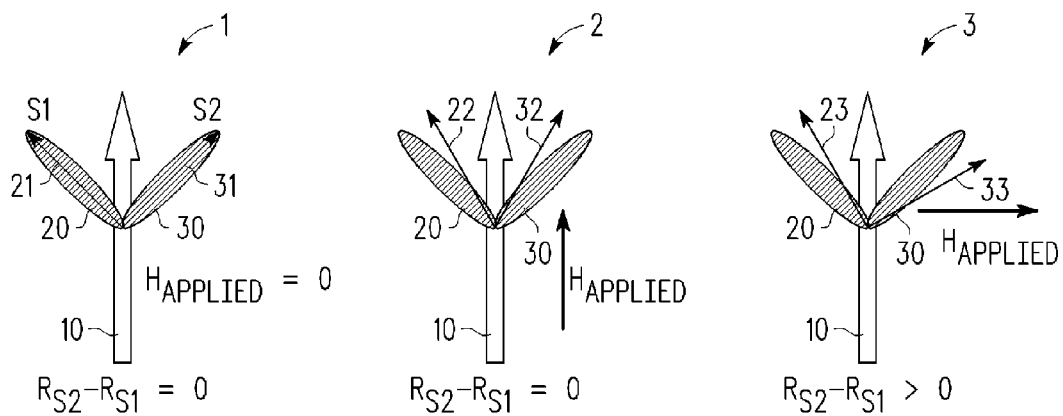
FIG. 1 illustrates two active sense elements having magnetizations that are angled equally in different directions from a pinned layer that will deflect in response to an externally applied magnetic field and provide an output signal related to the component of the magnetic field that is not aligned with the pinning direction of the pinned layer.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for fabricating a differential sensor in which unshielded sense elements are formed over pinned layers having a single pinning direction and are dynamically stabilized with an aligned field pulse that is applied periodically (e.g., during each measurement cycle). Using shape anisotropy, the shapes of two sense elements may be formed to have magnetizations that are angled equally in different directions from a single magnetization direction of the pinned layer so that the sense layers will deflect in response to an externally applied magnetic field. With this configuration, a single axis magnetic sensor may be formed from a single pinning direction, or a compass circuit may be formed from two differential sensor circuits so that only one pinning direction is required for each axis, thereby simplifying and reducing the manufacturing cost and complexity. In an example implementation, each differential sensor circuit is constructed as a Wheatstone bridge structure in which unshielded active sense elements are used to detect and measure an externally applied magnetic field. To address field fluctuations that can impair the field response of an unshielded sense element, the sensor layers may be dynamically stabilized by applying a field pulse either before each field measurement or at a predetermined interval to prepare the magnetic sensor, thereby eliminating the need for any hard bias layer(s) in the sense elements.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. In addition, selected aspects are depicted with reference to simplified cross sectional drawings without including every device feature or geometry in order to avoid limiting or obscuring the present invention. It is also noted that, throughout this detailed description, conventional techniques and features related to magnetoresistive Random Access Memory (MRAM) design, MRAM operation, semiconductor device fabrication, and other aspects of the integrated circuit devices may not be described in detail herein. While certain materials will be formed and removed to fabricate the integrated circuit sensors as part of an existing MRAM fabrication process, the specific procedures for forming or removing such materials are not detailed below since such details are well known and not considered necessary to teach one skilled in the art of how to make or use the present invention. Furthermore, the circuit/component layouts and configurations shown in the various figures contained herein are intended to represent example embodiments of the invention. It should be noted that many alternative or additional circuit/component layouts may be present in a practical embodiment.

Turning now to FIG. 1, a sensor structure 1 is shown in simplified schematic form which uses two active sense element types 20, 30 and a pinned layer 10 to measure an external magnetic field. As depicted, the magnetization directions (21, 31) of the active sense elements 20, 30 are angled equally and in different directions from the magnetization direction of a pinned layer 10. To this end, the sense elements 20, 30 may be formed so that the shape of each sense element is elongated (i.e., longer) in the direction of the desired magnetization for that sense element. Thus shaped, the sense elements 20, 30 use their shape anisotropy to create magnetization directions that are offset from the pinned layer 10. For example, the first sense element 20 may be formed so that its preferred magnetization direction is angled at −45 degrees from the magnetization direction of the pinned layer 10, and with the second sense element 30 so that its preferred magnetization direction is angled at 45 degrees from the magnetization direction of the pinned layer 10, although other offset angles may be used.

Because the resistance/conductance across a sense element and pinned layer depends on the cosine of the angle between the sense element and the pinned layer, the resistance/conductance of the sensor structure can be changed by applying an external magnetic field (H) which deflects the magnetization of the sensor elements 20, 30. For example, if there is no applied field (H=0) to a sensor structure 1, then the magnetization directions 21, 31 of the sense elements 20, 30 are unchanged, and there is no difference between the resistance/conductance of the first and second sensor elements 20, 30. And if an external field H is applied to a sensor structure 2 that is directed along or anti-parallel to the pinned layer 10, the applied field will deflect or rotate the magnetic moments 22, 32 of the sensor elements 20, 30 equally, resulting in equal resistance/conductance changes for each sense element, and hence no change in their difference. However, when an external field H is applied to a sensor structure 3 that is orthogonal to the pinned layer 10, the magnetic moments 23, 33 for each sense element 20, 30 are changed differently in response to the applied field. For example, when the external field H shown in FIG. 1 is directed to the right, the resistance/conductance of the first sense element 20 is reduced, while the resistance/conductance of the first sense element 20 is reduced, while the resistance/conductance of the second sense element 30 is increased, resulting in a difference signal that is related to the field strength. In this way, the depicted sensor structure measures the projection of the applied field perpendicular to the pinned axis, but not parallel to it.

Figure 2:
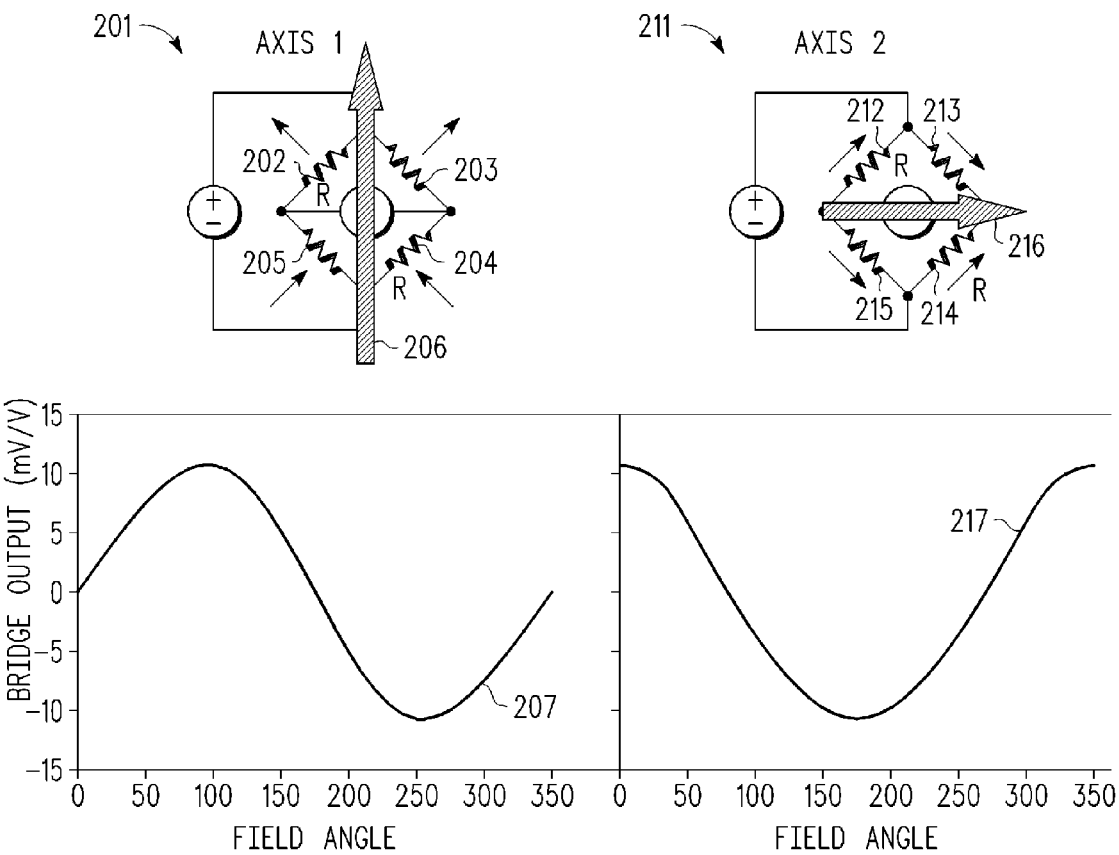
FIG. 2 illustrates an electronic compass structure which uses differential sensors formed from two bridge structures with unshielded MTJ sensors, along with the circuit output for each bridge structure.

FIG. 2 shows first and second sensors 201, 211 for detecting the component directions of an applied field along a first y-axis (Axis 1) and a second x-axis (Axis 2), respectively. As depicted, each sensor is formed with unshielded sense elements that are connected in a bridge configuration. Thus, the first sensor 201 is formed from the connection of sense elements 202-205 in a bridge configuration over a pinned layer 206 that is magnetized in a first direction. In similar fashion, the second sensor 211 is formed from the connection of sense elements 212-215 in a bridge configuration over a pinned layer 216 that is magnetized in a second direction that is perpendicular to the magnetization direction of the pinned layer 206. In the depicted bridge configuration 201, the sense elements 202, 204 are formed to have a first magnetization direction and the sense elements 203, 205 are formed to have a second magnetization direction, where the first and second magnetization directions are orthogonal with respect to one another and are oriented to differ equally from the magnetization direction of the pinned layer 206. As for the second bridge configuration 211, the sense elements 212, 214 have a first magnetization direction that is orthogonal to the second magnetization direction for the sense elements 213, 215 so that the first and second magnetization directions are oriented to differ equally from the magnetization direction of the pinned layer 216. In the depicted sensors 201, 211, there is no shielding required for the sense elements, nor are any special reference elements required. In an example embodiment, this is achieved by referencing each active sense element (e.g., 202, 204) with another active sense element (e.g., 203, 205) using shape anisotropy techniques to establish the easy magnetic axes of the referenced sense elements to be deflected from each other by 90 degrees.

By positioning the first and second sensors 201, 211 to be orthogonally aligned with the orthogonal sense element orientations in each sensor being deflected equally from the sensor's pinning direction, the sensors can detect the component directions of an applied field along the first and second axes. This is illustrated in FIG. 2 with the depicted circuit simulation shown below each sensor. In each simulation, the simulated bridge output 207, 217 is a function of an applied field angle for sense elements with an anisotropy field of 10 Oe, applied field of 0.5 Oe, and a magnetoresistance of 100% when the sense element switches from an anti-parallel state to a parallel state. The simulated bridge outputs can be used to uniquely identify any orientation of the applied external field. For example, a field that is applied with a 0 degree field angle (e.g., pointing "up" so that it is aligned with the y-axis or Axis 1) will generate a bridge output of 0 mV/V from the first sensor 201, and will generate a bridge output of 10 mV/V from the second sensor 201. Conversely, a field that is applied in the opposite direction (e.g., pointing "down" so that it is aligned with a 180 degree field angle) will generate a bridge output of 0 mV/V from the first sensor 201, and will generate a bridge output of −10 mV/V from the second sensor 201.

As seen from the foregoing, a magnetic field sensor may be formed from differential sensors 201, 211 which use unshielded sense elements 202-205, 212-215 connected in a bridge configuration over respective pinned layers 206, 216 to detect the presence and direction of an applied magnetic field. With this configuration, the possibility of residual magnetic moment present in magnetic shielding is eliminated. In addition, the magnetic field sensor provides good sensitivity, and also provides the temperature compensating properties of a bridge configuration. By eliminating the need to form magnetic shielding layers, the manufacturing complexity and cost is reduced and the size of the sensor structure is decreased (in terms of eliminating the silicon real estate required to form any shielding layers). There are also performance benefits to using unshielded sense elements since the magnetic remnance problem is eliminated by removing the magnetic shielding layers.

Figure 3:
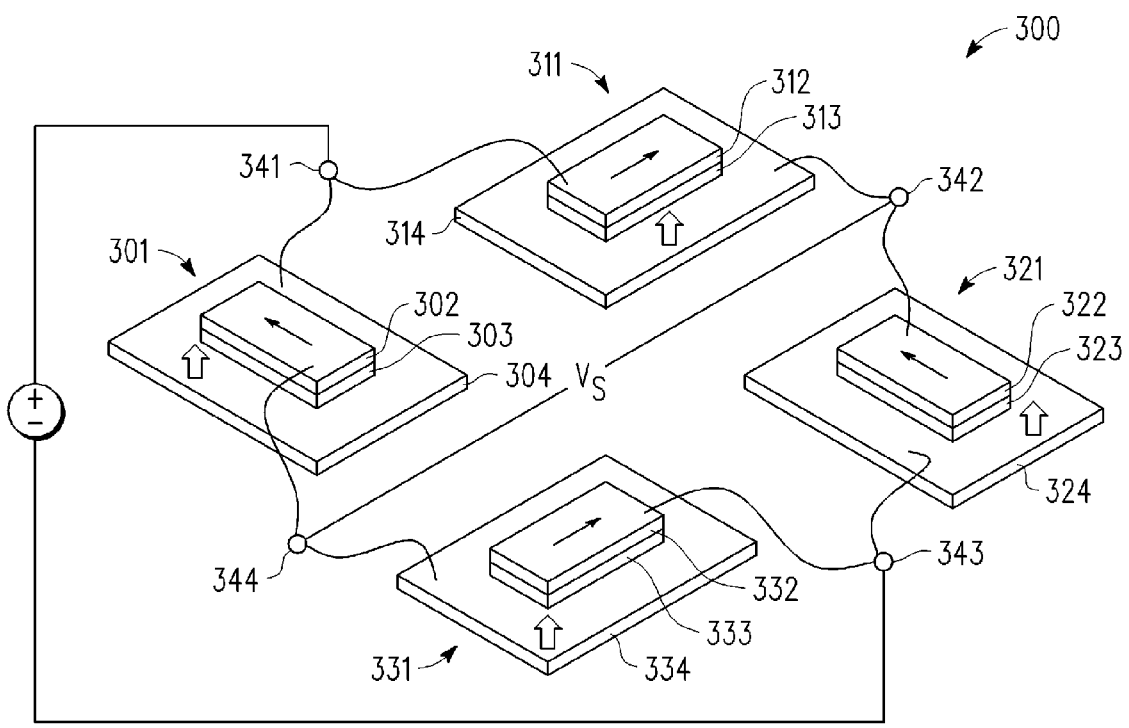
FIG. 3 provides a simplified schematic perspective view of a Wheatstone bridge circuit in which series-connected MTJ sensors are aligned to have different magnetization directions from the magnetization direction of the pinned layer.

FIG. 3 provides a simplified schematic perspective view of an example field sensor 300 formed by connecting four MTJ sensors 301, 311, 321, 331 in a Wheatstone bridge circuit, where the series-connected MTJ sensors 301, 311, 321, 331 are formed with sense layers 302, 312, 322, 332 that are aligned to have different magnetization directions from the magnetization direction of the pinned layers 304, 314, 324, 334. The depicted sensor 300 is formed with MTJ sensors 301, 311, 321, 331 that may be manufactured as part of an existing MRAM manufacturing process with only minor adjustments to control the orientation of the magnetic field directions for different layers. In particular, each MTJ sensor (e.g., 301) includes a first pinned electrode 304, an insulating tunneling dielectric layer 303, and a second sense electrode 302. The pinned and sense electrodes are desirably magnetic materials, for example, and not intended to be limiting, NiFe, CoFe, Fe, CoFeB and the like, or more generally, materials whose magnetization can be collectively aligned. Examples of suitable electrode materials and arrangements are the materials and structures commonly used for electrodes of magnetoresistive random access memory (MRAM) devices, which are well known in the art and contain, among other things, ferromagnetic materials. The pinned and sense electrodes may be formed to have different coercive force or field requirements. The coercive field is basically the amount of field that is required to reverse the magnet from one direction to another after saturation. Technically, it is the magnetic field required to return the magnetization of the ferromagnet to zero after it has been saturated. For example, the pinned electrodes 304, 314, 324, 334 may be formed with an anti-ferromagnetic film exchange coupled to a ferromagnetic film to with a high coercive field so that their magnetization orientation can be pinned so as to be substantially unaffected by movement of an externally applied magnetic field. In contrast, the sense electrodes 302, 312, 322, 332 may be formed with a magnetically soft material to provide different anisotropy axes having a comparatively low coercive force so that the magnetization orientation of the sense electrode (in whatever direction it is aligned) may be altered by movement of an externally applied magnetic field. In selected embodiments, the coercive field for the pinned electrodes is about two orders of magnitude larger than that of sense electrodes, although different ratios may be used by adjusting the respective coercive fields of the electrodes using well known techniques to vary their composition and/or pinning strength.

As shown in FIG. 3, the pinned electrodes 304, 314, 324, 334 in the MTJ sensors are formed to have a first exemplary anisotropy axis alignment in the plane of the pinned electrode layers 304, 314, 324, 334 (identified by the vector arrows pointing toward the top of the drawing of FIG. 3). As described herein, the anisotropy axis alignment for the pinned electrodes 304, 314, 324, 334 may be obtained using shape anisotropy of the pinned electrodes, in which case the shapes of the pinned electrodes 304, 314, 324, 334 would each be longer in the direction of the "up" vector arrow for a single layer pinned magnetic stack. In addition or in the alternative, the anisotropy axis alignment for the pinned electrodes 304, 314, 324, 334 may be obtained by forming one or more magnetic layers in the presence of a saturating magnetic field that is subsequently or concurrently annealed and then cooled so that the magnetic field direction of the pinned electrode layers is set in the direction of the saturating magnetic field. As will be appreciated, the formation of the anisotropy axis alignment for the pinned electrodes 304, 314, 324, 334 must be reconciled with the fabrication steps used to form any other field sensors which include pinned electrodes having a distinct anisotropy axis alignment, as well as any fabrication steps used to form any sense electrodes having a distinct anisotropy axis alignment.

The depicted field sensor 300 also includes MTJ sensors 301, 321 in which sense electrodes 302, 322 are formed to have an exemplary anisotropy axis (identified by the left-pointing vector arrows) that is offset from the anisotropy axis of the pinned electrodes by a first deflection angle. In addition, the depicted field sensor 300 includes MTJ sensors 311, 331 in which sense electrodes 312, 332 are formed to have an exemplary anisotropy axis (identified by the right-pointing vector arrows) that is offset from the anisotropy axis of the pinned electrodes by a second deflection angle which is equal but opposite to the first deflection angle. In a particular embodiment, the first deflection angle is perpendicular to the second deflection angle so that anisotropy axis of the sense electrodes 302, 322 is rotated negative 45 degrees with respect to the anisotropy axis of the pinned electrodes, and so that anisotropy axis of the sense electrodes 312, 332 is rotated positive 45 degrees with respect to the anisotropy axis of the pinned electrodes.

As will be appreciated, the MTJ sensors 301, 311, 321, 331 may be formed to have identical structures that are connected as shown in series by metal interconnections in a standard Wheatstone bridge circuit configuration with both power supply terminals 341, 343 and output signal terminals 342, 344 for the bridge circuit being shown. By connecting in series the unshielded MTJ sensors 301, 311, 321, 331 in a Wheatstone bridge circuit, the field sensor 300 detects the horizontal direction (left to right in FIG. 3) component of an externally applied magnetic field, thereby forming an X-axis sensor bridge. In particular, a horizontal field component would deflect the magnetization of the sense electrodes 302, 322 differently from the deflection of the magnetization of the sense electrodes 312, 332, and the resulting difference in sensor conductance/resistance would quantify the strength of the horizontal field component. Though not shown, a Y-axis sensor bridge circuit may also be formed with unshielded MTJ sensors connected in a Wheatstone bridge circuit configuration, though the anisotropy axis of the pinned electrodes in the Y-axis sensor bridge circuit would be perpendicular to the anisotropy axis of the pinned electrodes 304, 314, 324, 334 in the X-axis sensor bridge.

Low field magnetic sensors are susceptible to Barkhausen noise, sporadic de-pinning, jumps of micro-magnetic domains (resulting from different regions in the magnetic sense element that may have slightly different orientations of their local magnetic moment from in weak local pinning that is caused by edge roughness caused by small local inhomogeneities in the sense layer), or a myriad of other sources. Such noise can introduce errors in accurately measuring the angular resolution of the Earth's magnetic field. When a field is applied, these micro-magnetic domains may reverse in a sequential fashion in lieu of the desired coherent rotation of the sense element. Prior attempts to address such noise have used a hard magnetic bias layer in the sense layers to pin the ends of the device. However, hard bias layers can reduce the sensitivity of the sensor, and have the additional disadvantages of requiring an additional processing layer, etch step and anneal step.

To address the Barkhausen noise problem, a magnetic field may be selectively applied along the easy axis of the sense element prior to performing a measurement. In selected embodiments, the magnetic field is applied as a brief field pulse that is sufficient to restore the magnetic state of the sense element and remove micro-magnetic domains that may have appeared as the result of exposure to a strong field. In an example implementation, a field pulse is applied to a sensor to remove metastable pinned regions in the sense element, where the field pulse has a threshold field strength (e.g., above approximately 40 Oe) and a minimum pulse duration (e.g., of approximately 20-100 nanoseconds). By applying such a field pulse with a predetermined measurement period (e.g., 10 Hz) as required for a compass application, the resulting field pulse has an extremely low duty cycle and minimal power consumption. In addition, by terminating the field pulse prior to measurement, there is no additional field applied to the sense element during measurement, resulting in maximal sensitivity.

Figure 4:
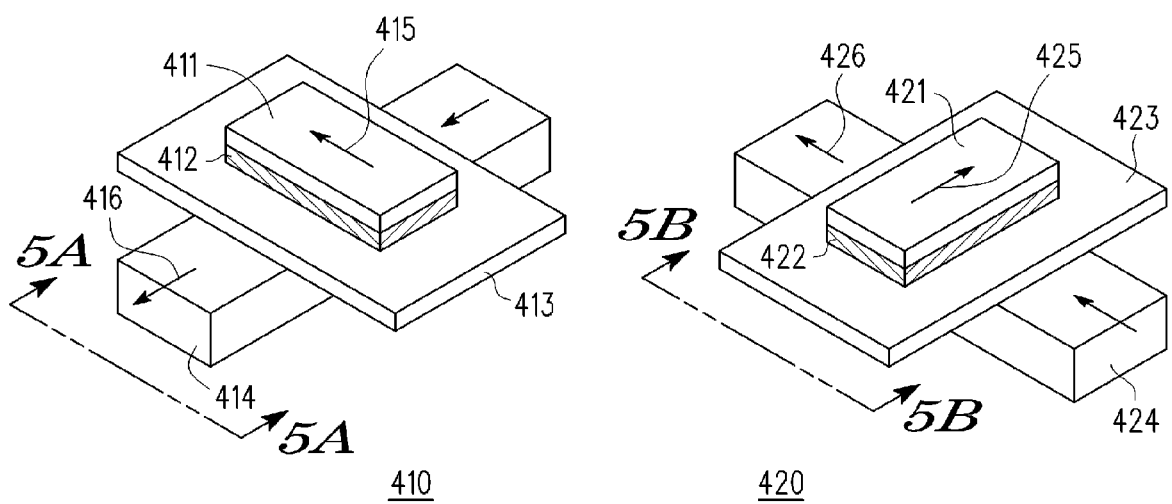
FIG. 4 is a partial schematic perspective view of first and second MTJ sensors which include a magnetic field generator structure for clearing or stabilizing the sense layer prior to or during sense operations.

To illustrate an example of how a field pulse may be applied to a sense element, reference is now made to FIG. 4, which shows a partial schematic perspective view of first and second MTJ sensors 410, 420 which each include a magnetic field generator structure 414, 424 for resetting or stabilizing the sense layer 411, 421 prior to or during sense operations. Each MTJ sensor may be constructed as shown in FIG. 4 where the magnetic direction of the sense layer determines the orientation of the magnetic field generator structure. In particular, each MTJ sensor generally includes an upper ferromagnetic layer 411, 421, a lower ferromagnetic layer 413, 423, and a tunnel barrier layer 412, 422 between the two ferromagnetic layers. In this example, the upper ferromagnetic layer 411, 421 may be formed to a thickness in the range 10 to 10000 Angstroms, and in selected embodiments in the range 10 to 100 Angstroms, and functions as a sense layer or free magnetic layer because the direction of its magnetization can be deflected by the presence of an external applied field, such as the Earth's magnetic field. As for the lower ferromagnetic layer 413, 423, it may be formed to a thickness in the range 10 to 2000 Angstroms, and in selected embodiments in the range 10 to 100 Angstroms, and functions as a fixed or pinned magnetic layer when the direction of its magnetization is pinned in one direction that does not change magnetic orientation direction during normal operating conditions. As described above, the first and second MTJ sensors 410, 420 may be used to construct a differential sensor by forming the lower pinned layers 413, 423 to have the same magnetization direction (not shown), and by forming the magnetization direction 415 in upper sense layer 411 to be orthogonal to the magnetization direction 425 in upper sense layer 421 so that the magnetization directions 415, 425 are oriented in equal and opposite directions from the magnetization direction of the lower pinned layers 413, 423.

To restore the original magnetization of the upper sense layers 411, 421 that can be distorted by magnetic domain structure, FIG. 4 depicts a magnetic field generator structure 414, 424 formed below each sensor. In selected embodiments, the magnetic field generator structure 414, 424 is formed as a conducting current line which is oriented to create a magnetic field pulse which aligns with the magnetization direction 415, 425 in the upper sense layer 411, 421. For example, when a current pulse flows through the magnetic field generator structure 414 below the first MTJ sensor 410 in the direction indicated by the arrow 416, a field pulse is created that is aligned with the easy axis 415 of the sense element 411 in the first MTJ sensor 410. However, since the second MTJ sensor 420 has a sense layer 421 with a different magnetization direction 425, the magnetic field generator structure 424 is oriented so that a field pulse is created that is aligned with the easy axis 425 of the sense element 421 in the second MTJ sensor 420 when a current pulse flows through the magnetic field generator structure 424 in the direction indicated by the arrow 426.

Figure 5:
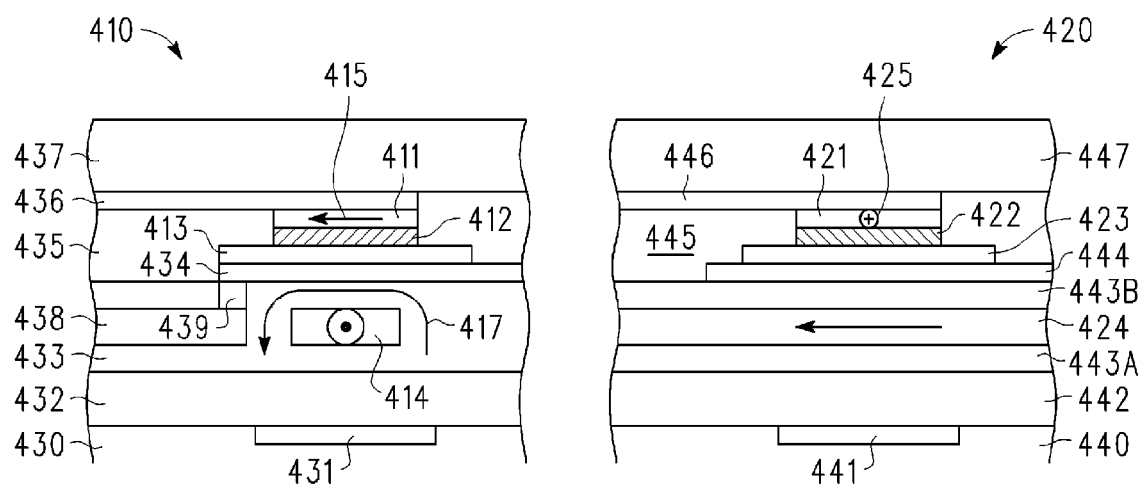
FIG. 5 is a partial cross-sectional view of an integrated circuit in which the first and second MTJ sensors shown in FIG. 4 are formed to have sense layers with different magnetization directions.

The relative alignment of the field pulse and easy axis directions may also be seen in FIG. 5, which depicts a partial cross-sectional view of an integrated circuit device in which the first and second MTJ sensors shown in FIG. 4 are formed to have sense layers 411, 421 with different magnetization directions. In particular, the cross-sectional view on the left shows the first MTJ sensor 410 as seen from the perspective view 5A in FIG. 4, while the cross-sectional view on the right shows the second MTJ sensor 420 as seen from the perspective view 5B in FIG. 4. The first and second MTJ sensors 410, 420 are each formed over a substrate 430, 440 which may have an active circuit 431, 441 embedded therein. On the substrate, one or more circuit layers 432, 442 may be formed before forming an insulating layer 433, 443 in which a conductive line 414, 424 is embedded to form a magnetic field generator structure. As shown in FIG. 5, the conductive line 414 in the first MTJ sensor 410 is formed to carry current in the direction coming out of plane of the drawing of FIG. 5, while the conductive line 424 in the second MTJ sensor 420 is formed to carry current moving right-to-left on the drawing. Over the embedded conductive lines, the first and second MTJ cores are formed in an insulating layer 435, 445. In particular, the first MTJ core in the first MTJ sensor 410 includes a first conductive line 434 at least partially embedded in the insulating layer 435, a lower pinned ferromagnetic layer 413, a tunnel barrier layer 412, an upper sense ferromagnetic layer 411 having a magnetization direction 415 that is oriented right-to-left, and a second conductive line 436 over which is formed an additional dielectric layer 437. The first conductive layer 434 is connected to a bottom contact layer 438 through a via structure 439. In addition, the second MTJ core in the second MTJ sensor 420 includes a first conductive line 444 at least partially embedded in the insulating layer 445, a lower pinned ferromagnetic layer 423, a tunnel barrier layer 422, an upper sense ferromagnetic layer 421 having a magnetization direction 425 that is oriented into the plane of the drawing of FIG. 5, and a second conductive line 446 over which is formed an additional dielectric layer 447. To connect the first and second MTJ sensors 410, 420, the first conductive layer 444 in the second MTJ sensor 420 is connected through a via structure (not shown) to a bottom contact layer (not shown) in the same level as the embedded conductive line 424, which in turn is connected through one or more vias and conductive layers to the second conductive line 436 from the first MTJ sensor 410. With the depicted configuration, current pulses through the embedded conductive line 414 will create a magnetic field pulse 417 which is aligned with the easy axis 415 of the sense element 411, and current pulses through the embedded conductive line 424 will create a magnetic field pulse in the region of the sense element 421 (not shown) which is aligned with the easy axis 425 of the sense element 421.

In accordance with selected embodiments, the first and second MTJ sensors 410, 420 may be fabricated together on a monolithic integrated circuit as part of a differential sensor by forming sense layers 411, 421 having orthogonal magnetic orientations that each differ equally from the magnetic direction of the pinned layers 413, 423. In an example process flow, the first step in the fabrication process is to provide a monolithic integrated circuit chip substrate which is covered by a dielectric base layer (not shown). Over the dielectric base layer, magnetic field generator structures 414, 424 are formed as embedded lines of conductive material using known deposition, patterning and etching processes so that the magnetic field generator structures 414, 424 are aligned and positioned below the sensors 410, 420 and embedded in an insulating layer (not shown). Upon the insulating layer, a stack of sensor layers is sequentially formed by depositing a first conductive layer (to serve after etching as the conductive line 434), one or more lower ferromagnetic layers (to serve after etching as the lower pinned ferromagnetic layer 413), one or more dielectric layers (to serve after etching as the tunnel barrier layer 412), one or more upper ferromagnetic layers (to serve after etching as the upper sense ferromagnetic layer 411), and a second conductive layer (to serve after etching as the conductive line 436).

While the various ferromagnetic layers may each be deposited and heated in the presence of a magnetic field to induce a desired magnetic orientation, shape anisotropy techniques may also be used to achieve the required magnetic orientations for the different ferromagnetic layers. To this end, the sensor layer stack is selectively etched with a sequence of patterned etch processes to define the pinned and sense layers in the MTJ sensors 410, 420. In a first etch sequence, the shapes of the different pinning layers 413, 423 are defined from the lower ferromagnetic layer(s) by using patterned photoresist to form a first patterned hard mask and then performing a selective etch process (e.g., reactive ion etching) to remove all unmasked layers down to and including the unmasked lower ferromagnetic layer(s). The resulting shapes of the etched lower ferromagnetic layers are oriented so that each pinned layer has shape anisotropy, resulting in a preferred magnetic orientation along one of its axes. In addition to being formed as long and narrow shapes, additional shaping of the ends of pinned layers may be provided so that each of the pinned layers performs more like a single magnetic domain. For example, the pinned layers 901, 902, 903, 904 shown in FIG. 9 layers may be shaped to have pointed ends that taper in the corresponding directions of desired pinned direction for the pinned layers. Using shape anisotropy, the shaped pinned layers 413, 423 may be annealed to set their respective pinning directions.

At this point in the fabrication process, the upper ferromagnetic layer(s) will have been selectively etched to leave a remnant portion under the first patterned hard mask so that the upper and lower ferromagnetic layer(s) have the same shape. However, the final shape of the sense layers will be smaller than the underlying pinned layers, and to this end, a second etch sequence is used to define the final shapes of the different sense layers 411, 421 from the remnant portions of the upper ferromagnetic layer(s). In the second etch sequence, another photoresist pattern is used to form a patterned hard mask over the parts of the remnant upper ferromagnetic layer(s) layer that will form the sense layers. The pattern is selected to define high aspect ratio shapes for the sense layers when a selective etch process (e.g., reactive ion etching) is used to remove all unmasked layers down to and including the unmasked upper ferromagnetic layer(s) 411, 421. In selected embodiments, the selective etch process may leave intact the underlying shaped pinned layers 413, 423, though in other embodiments, the selective etch process also etches the unmasked portions of the underlying shaped pinned layers 413, 423. The defined high aspect ratio shapes for the sense layers are oriented so that the sense layers 411 are longer in the dimension of the desired magnetization 415 than they are wide, while the sense layers 421 are longer in the dimension of the desired magnetization 425 than they are wide. In other words, the long axis for each sense layer is drawn along the desired magnetization direction for a single ferromagnetic sense layer. In addition to being formed as long and narrow shapes, additional shaping of the ends of sense layers 411, 421 may be provided so that each of the sense layers performs more like a single magnetic domain. For example, the sense layers may be shaped to have pointed ends that taper in the corresponding directions of desired easy axis for the sense layers. Once the shaped sense layers are formed, the desired easy axis magnetic orientations may be induced from their shape anisotropy by briefly annealing the wafer (e.g., at an anneal temperature of approximately 250 degrees C. in the absence of a magnetic field to remove material dispersions. Upon cooling, the magnetizations of the sense layers 411, 421 align with the individual pattern, providing multiple orientations of sense layers.

Figure 6:
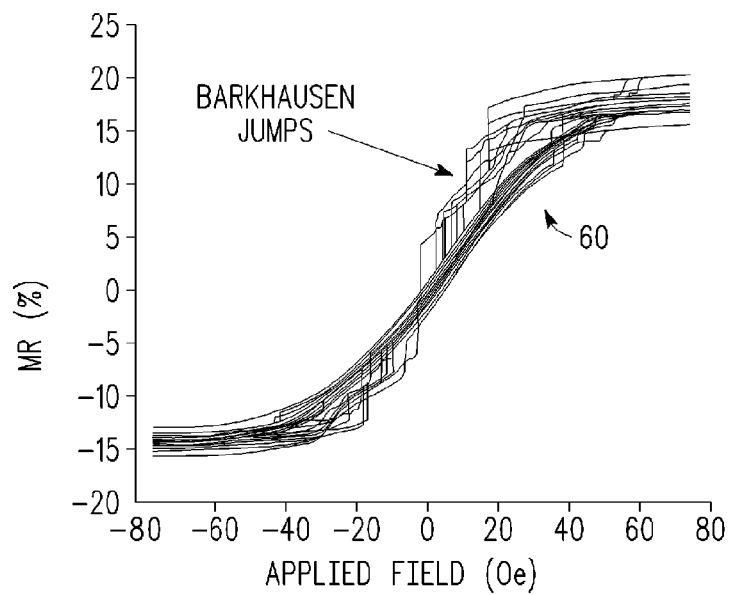
FIG. 6 provides an example plot of the magneto-resistance against the applied field when no stabilization field is applied to the sensor.
Figure 7:
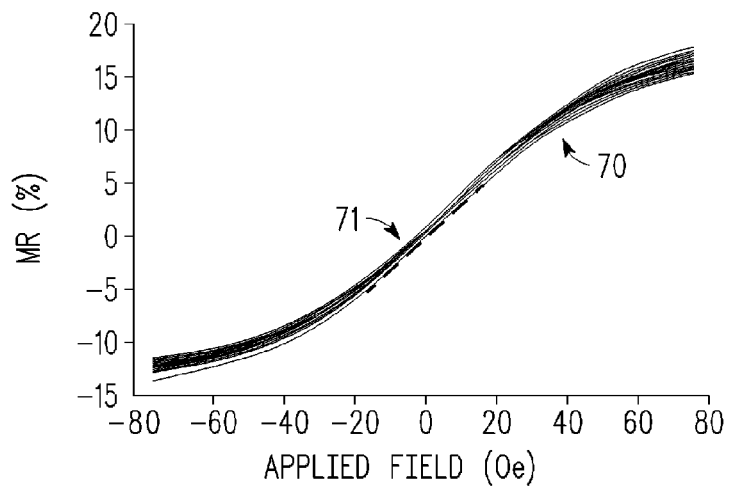
FIG. 7 provides an example plot of the magneto-resistance against the applied field when a steady state stabilization field is applied to the sensor.
Figure 8:
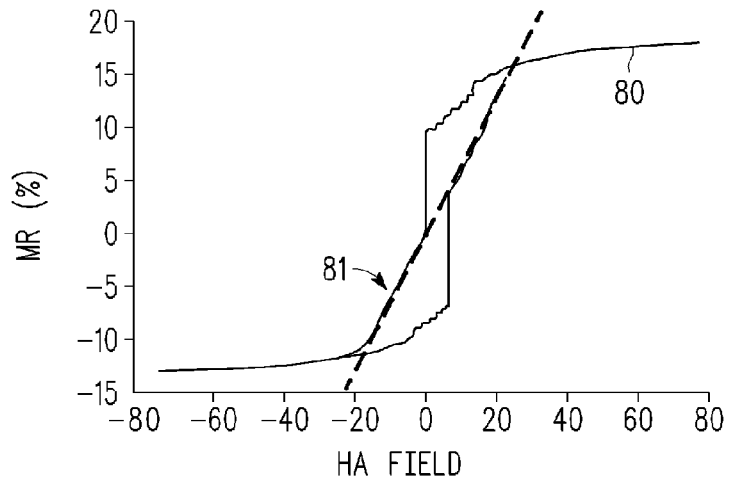
FIG. 8 provides an example plot of the magneto-resistance against the applied field when a pulsed stabilization field is applied to the sensor.

By controlling the magnitude and timing of the current flow through the magnetic field generator structures 414, 424 so as to create a field pulse just prior to using the sensors 410, 420 to perform a field measurement, the sense layers 411, 421 are prepared before each measurement in a way that maintains high sensitivity and minimizes power consumption. The benefits of selectively applying a magnetic field to the sense elements are demonstrated in FIGS. 6-8. Starting with FIG. 6, there is provided an example plot of the magneto-resistance against the applied field when no stabilization field is applied to the sensor. Without a stabilization field, the micro-magnetic domain jumps cause the transfer curve 60 to have sporadic, unpredictable jumps in magneto-resistance (a.k.a., Barkhausen noise) as an applied field is swept. This noise may be prevented by applying a weak stabilization field in alignment with the easy axis of the sense element. For example, FIG. 7 provides an example plot of the magneto-resistance against the applied field when a 15 Oe easy axis stabilization field is applied as a steady state field to the sensor. As shown in the plot of FIG. 7, the micro-magnetic domain jumps have been eliminated. As a consequence, the transfer curve 70 in this example includes a region of linear characteristics 71 up to an applied field of approximately 20 Oe. In addition or in the alternative, a field pulse may be applied to further improve the transfer curve, as shown in FIG. 8 which provides an example plot 80 of the magneto-resistance against the applied field when a pulsed stabilization field is applied to the sensor. In particular, the transfer curve 80 was obtained by briefly pulsing a sensor element along its easy axis immediately prior to performing a field measurement at the sensor with a sequence of field sweeps, starting with a first sweep from −5 Oe to 5 Oe, and then performing a second sweep from −10 Oe to 10 Oe, and so on. The resulting transfer curve 80 includes a region of linear characteristics 81 up to at least an applied field of approximately 20 Oe. In addition, the transfer curve 80 indicates that poor performance may be created when this sensor is exposed to a hard axis field above approximately 40 Oe. Stated more generally, a strong field applied at an arbitrary direction may put the sense element in a bad state, while a field pulse applied along the sensor easy axis is sufficient to remove domain structure from the sense element.

In a practical deployment, the magnetic field generator structures 414, 424 are formed from the same layer that is necessary to interconnect the bridge legs, and hence creates no additional processing steps. In addition, each of the magnetic field generator structures 414, 424 may be constructed from a single conductive element that is positioned to pass beneath each MTJ sensor with the appropriate orientation, thereby creating field pulses throughout the chip with a single current pulse. An example of such a practical implementation is illustrated with FIG. 9 which provides a simplified schematic top or plan view of a reticle layout showing differential sensor 900 formed with a plurality of series-connected MTJ sensors 921, 922, 923, 924 configured in a Wheatstone bridge circuit with a magnetic field generator structure 920 positioned in relation to the MTJ sensors. The depicted differential sensor includes four pinned layers 901, 902, 903, 904 which each have the same magnetization direction (e.g., a pinned axis in the y-direction), as shown by the large vector arrow on each pinned layer. While the pinned layers 901, 902, 903, 904 may be formed using their shape anisotropy (as indicated in FIG. 9), they may also be formed using a traditional field-anneal process.

Figure 9:
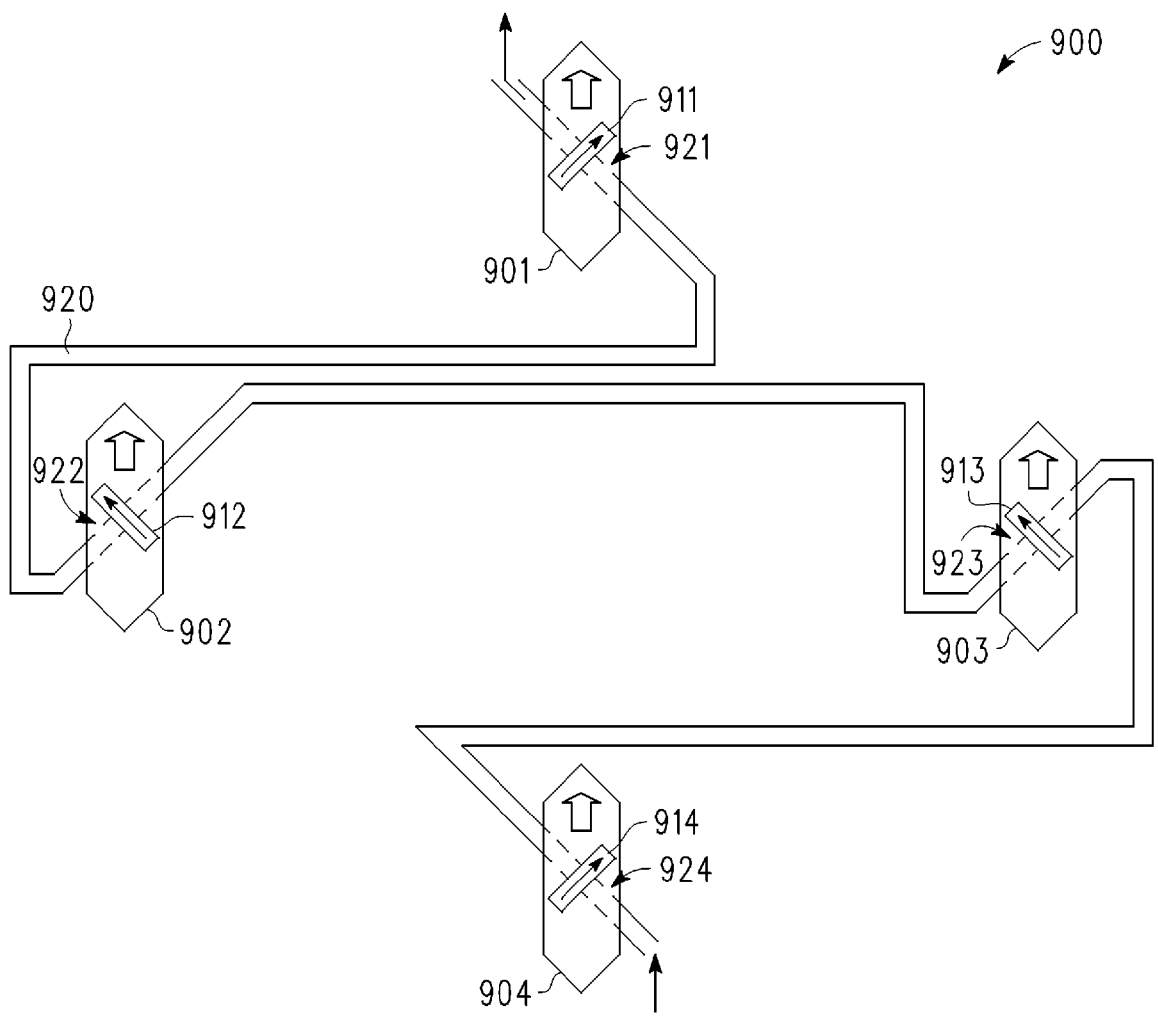
FIG. 9 which provides a simplified schematic top or plan view of a reticle layout showing differential sensor formed with a plurality of series-connected MTJ sensors configured in a Wheatstone bridge circuit with a magnetic field generator structure positioned in relation to the MTJ sensors.

FIG. 9 also shows that two of the MTJ sensors 921, 924 in the differential sensor are formed with sense layers 911, 914 having a magnetization direction that is oriented at 45 degrees from vertical, as shown with the easy axis vector pointing to the right in the sense layers 911, 914. The other two MTJ sensors 902, 903 are formed with sense layers 912, 913 having a magnetization direction that is oriented at negative 45 degrees from vertical, as shown with the easy axis vector pointing to the left in the sense layers 912, 913. While any desired technique may be used to form the sense layers having different magnetization directions, selected embodiments of the present invention use shape anisotropy techniques to shape the sense elements 911, 914 to have a magnetization direction (or easy axis) that is oriented at predetermined deflection angle from vertical, and to shape the sense elements 912, 913 to have a magnetization direction (or easy axis) that is oriented negatively at the predetermined deflection angle from vertical. In this way, the magnetization direction of the sense elements 911, 914 and the magnetization direction of the sense elements 912, 913 are offset equally in opposite directions from the magnetization direction of the pinned layers 901, 902, 903, 904.

The depicted differential sensor 900 also includes a magnetic field generator structure 920 which is formed beneath the MTJ sensors 921, 922, 923, 924 so as to selectively generate a magnetic field to stabilize or restore the magnetic field of the sense layers 911, 912, 913, 914. In selected embodiments, the magnetic field generator structure 920 is formed as a single conductive line which is arranged to carry current beneath the sense layers 911, 912, 913, 914 in a direction that is perpendicular to the easy axis orientation of the sense layers so that the magnetic field created by the current is aligned with the easy axis. Thus, the conductive line 920 is formed below the fourth MTJ sensor 924 to create a magnetic field that is aligned with the easy axis of the sense element 914. In addition, the orientation of the conductive line 920 below the second and third MTJ sensors 922, 923 creates a magnetic field that is aligned with the easy axis of the sense elements 912, 913. Finally, the conductive line 920 is formed below the first MTJ sensor 921 to create a magnetic field that is aligned with the easy axis of the sense element 911.

Figure 10:
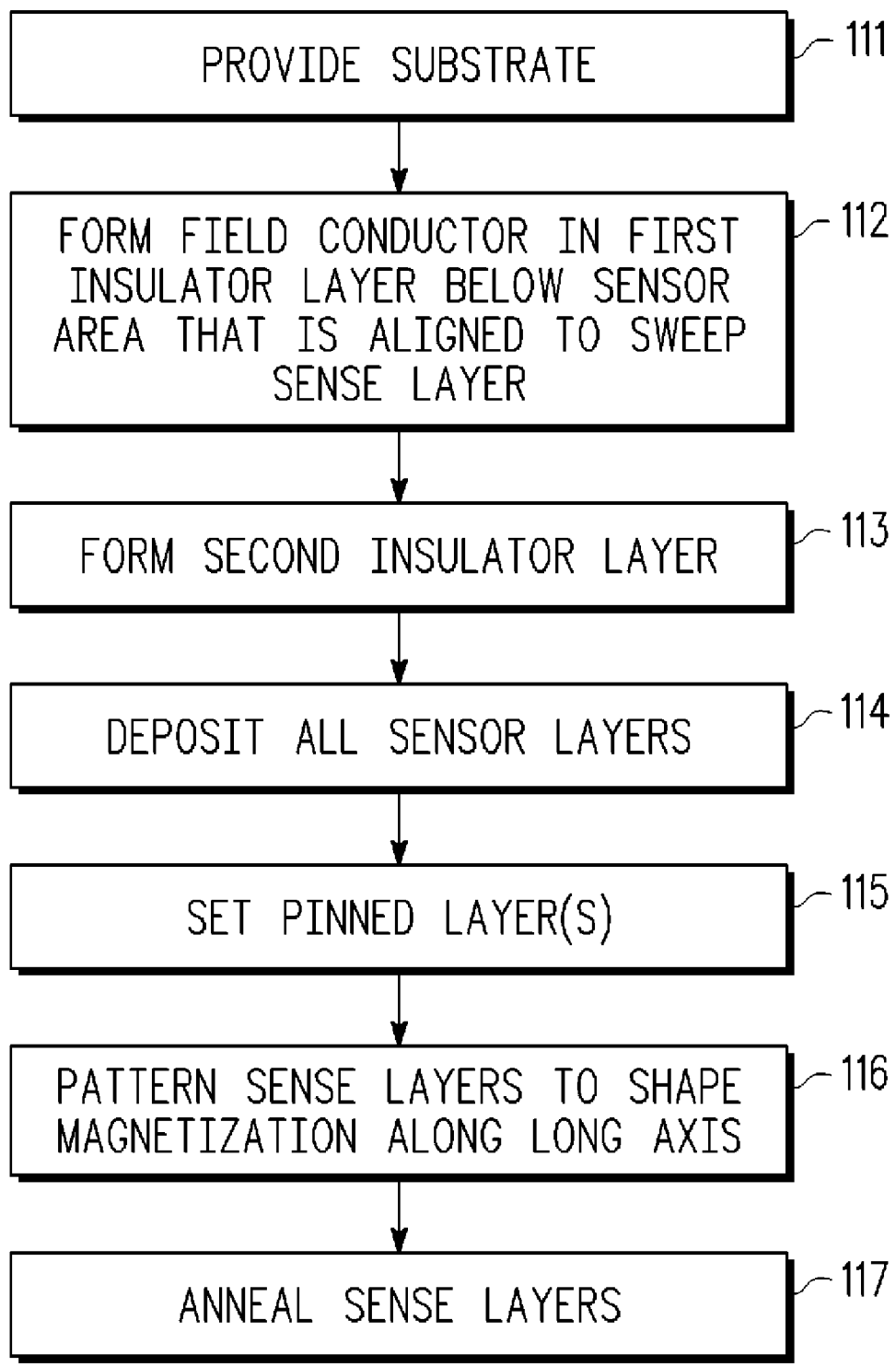
FIG. 10 is a flowchart showing a method of fabricating MTJ field sensors which are immune to micro-magnetic domain switches and which may be used to provide differential sensing using unshielded or active sense elements.

Selected embodiments of the present invention may also be illustrated with reference to FIG. 10, which depicts an example flowchart for a method of fabricating MTJ field sensors which do not exhibit micro-magnetic structure and which may be used to provide differential sensing using unshielded or active sense elements. At step 111, the substrate is provided using known semiconductor processing techniques. As will be appreciated, the substrate may have one or more active circuit elements formed therein, such as smart power or analog integrated circuits. The substrate and active circuit(s) may be formed as part of a front-end MRAM fabrication process.

At step 112, an embedded field conductor is formed over the substrate/circuit structure using known semiconductor processing techniques. The field conductor will serve as a magnetic field generator structure for the subsequently-formed sense layers, and therefore is patterned and positioned below the sensors so that it generates a field that is aligned with the easy axis of the sense layer in each sensor. To form the embedded field conductor, a first insulating layer, such as an interlayer dielectric (ILD), is formed over the substrate/circuit structure using known semiconductor processing techniques. Subsequently, a conductive layer is formed, for example, via physical vapor deposition and electroplating to deposit a conductive material, such as copper or a copper-based alloy. The conductive layer is then patterned and etched or a damascene process is used to define the field conductor to be positioned below the sensor areas and the bridge sensor interconnection paths. At step 113, a second insulating layer is formed above the first insulating layer and the embedded conductor using known semiconductor processing techniques. Vias are subsequently etched in the insulating layer to provide interconnection between the sensor lower electrode and bridge interconnection paths.

At step 114, the MTJ core structures are formed by depositing the sensor layers over the second insulating layer using a multi-step fabrication process. At this point, the sensor layers may be formed as part of a back-end MRAM fabrication process which occurs after the front-end fabrication process. In an example embodiment, the sensor layers are formed by depositing a first conductor layer (e.g., aluminum, copper, tantalum, tantalum nitride, titanium, titanium nitride or the like) that will serve as a conductive contact line (e.g., first conductive line 434 shown in FIG. 5). At least a first pinned ferromagnetic electrode layer (e.g., iridium manganese, platinum manganese, cobalt iron, cobalt iron boron, nickel iron, ruthenium, and the like, or any combination thereof) is then deposited on and in electrical contact with the first conductor layer. The materials chosen to form the first ferromagnetic electrode layer should have a relatively high coercive force, and should be sufficiently refractory so as to withstand annealing temperatures (e.g., 200 to 350 degrees C.) used to pin the first ferromagnetic electrode layer in a predetermined orientation. After depositing the first ferromagnetic electrode layer(s), a tunneling dielectric layer (e.g., aluminum oxide or magnesium oxide) is grown or deposited on the first ferromagnetic electrode layer(s), and then at least a second ferromagnetic electrode layer (e.g., nickel iron, cobalt iron, cobalt iron boron, ruthenium, and/or the like) is then deposited over the tunneling dielectric layer to form the second ferromagnetic electrode layer. The combination of materials used to form the second ferromagnetic electrode layer should have a lower coercive force than the materials making up the first ferromagnetic electrode layer, generally achieved through the pinning of the lower electrode layer. In addition, a capping layer of conductive material (e.g., tantalum, tantalum nitride, titanium, titanium nitride, and the like) may be formed over the second ferromagnetic electrode layer. Finally, a second conductor layer (e.g., aluminum, copper, tantalum, tantalum nitride, titanium, titanium nitride or the like) is deposited that will serve as a conductive contact line (e.g., second conductive line 436 shown in FIG. 5).

At step 115, the magnetization direction of the pinned layer is set. In selected embodiments, the first ferromagnetic electrode layer may be annealed in the presence of a magnetic field to set its magnetization direction, thereby defining the pinned layer. However, in other embodiments requiring distinct pinned layers with perpendicular magnetization orientations, the first ferromagnetic electrode layer may be used to form the distinct pinned layers by using the shape anisotropy of the distinct pinned layers and a carefully selected anneal process. To this end, the first ferromagnetic electrode layer may be selectively patterned and etched to define pinned layers which are shaped to have a longer dimension in the direction of the desired magnetization direction. By applying a saturating magnetic field that is oriented between the perpendicular magnetization orientations for the desired pinned layers, and then removing the field, the applied magnetization in the shaped pinned layers relaxes along the long axis of the shaped pinned layers. In yet other embodiments, the distinct pinned layers may be formed by depositing separate ferromagnetic electrode layers and using a two-step annealing process.

At step 116, sense layers are formed having different magnetization directions so that a first sense layer and a second sense layer for different sensors are deflected equally and in opposite directions from the magnetization direction of a pinned layer for those sensors. The second ferromagnetic electrode layer may be used to obtain different easy axis orientations for different sense layers by using the shape anisotropy of the different sense layers. To this end, the second ferromagnetic electrode layer may be selectively patterned and etched to define sense layers which are shaped to have a longer dimension in the direction of the desired magnetization direction.

It will be appreciated that additional processing steps will be used to fabricate of MTJ sensor structures. As examples, one or more dielectric, ferromagnetic and/or conductive layers may be deposited, patterned and etched using well known techniques, along with conventional backend processing (not depicted), typically including formation of multiple levels of interconnect that are used to connect the sensor structures in a desired manner to achieve the desired functionality. Thus, the specific sequence of steps used to complete the fabrication of the sensor structures may vary, depending on the process and/or design requirements.

The disclosed fabrication process may be used to form a magnetic field sensor from two differential sensor configurations for a single axis response, with only a single pinned direction. For two axis (X,Y) magnetic field response, the sensor only requires two distinct pinning axes, where each differential sensor is formed from a bridge structures with unshielded MTJ sensors. The distinct pinning axes may be obtained using shape anisotropy of differently shaped pinning layers in combination with a carefully selected anneal process, or by forming two distinct pinning layers which are separately set and annealed. In a given differential sensor formed from MTJ sensors connected in a bridge circuit, shape anisotropy may be used to create sense elements having different magnetizations at zero field that are angled at negative 45 degrees and 45 degrees from the magnetization of the pinned layer. In this configuration, an applied field that includes a component that is orthogonal to the pinning direction will change the magnetization of the different sense layers differently, and as a result, the differential sensor is able to measure the projection of the applied field perpendicular to the pinned axis. The disclosed fabrication process also forms a field conductor below each MTJ sensor that may be used to apply a field pulse along the easy axis of the sense layers to prepare the sensor for measurement, and a small current to stabilize the sensor during measurement if desired.

By now it should be appreciated that there has been provided a method and apparatus for detecting magnetic fields with a magnetic field sensor. As disclosed, the field sensor includes an unshielded magnetic tunnel junction (MTJ) sensor and an embedded magnetic field pulse generator formed over a substrate. The MTJ sensor includes a first ferromagnetic layer having a relatively fixed magnetic direction, a tunnel barrier layer formed adjacent to the first ferromagnetic layer, and a second ferromagnetic layer formed adjacent to the tunnel barrier layer and having a relatively free magnetic direction oriented along an easy axis. In selected embodiments, the second ferromagnetic layer has shape anisotropy with a longer length dimension and a shorter width dimension, where the longer length dimension is aligned with the easy axis which may be deflected 45 degrees from the relatively fixed magnetic direction. The embedded magnetic field pulse generator is formed in one or more dielectric layers, and is positioned in relation to the MTJ sensor to generate a magnetic field pulse that is aligned with the easy axis of the second ferromagnetic layer so that the pulse can be applied to prepare the unshielded MTJ sensor for measurement. In selected embodiments, the magnetic field pulse generator is implemented as a conductive line that is embedded in one or more insulating layers and positioned to produce a magnetic field pulse that resets the magnetic direction of the second ferromagnetic layer along the easy axis. The magnetic field pulse generator may also be configured to apply a weak magnetic field along the easy axis of the second ferromagnetic layer. The unshielded MTJ sensor may coupled to additional unshielded MTJ sensors in a Wheatstone bridge circuit configuration to form a differential sensor. In this circuit configuration, the embedded magnetic field pulse generator may be positioned with respect to each of the plurality of unshielded MTJ sensors to generate a magnetic field pulse along an easy axis of a sense layer in each of the plurality of unshielded MTJ sensors.

In another form, there is provided a magnetic field sensor apparatus, method and associated fabrication process for forming the magnetic field sensor. The disclosed magnetic field sensor includes first and second differential sensor circuits formed over a common substrate. The first differential sensor circuit detects a first component direction of an applied magnetic field along a first axis, while the second differential sensor circuit detects a second component direction of the applied magnetic field along a second axis that is orthogonal to the first axis. In particular, each of the first and second differential sensor circuits may be configured as a Wheatstone bridge structure of unshielded magnetic tunnel junction (MTJ) sensors formed with a plurality of unshielded sense layers and a corresponding plurality of pinned layers that are each magnetized in a pinning direction such that the pinning direction for the first differential sensor circuit is aligned with the first axis, and the pinning direction for the second differential sensor circuit is aligned with the second axis. In selected embodiments, each of the first and second differential circuits includes a first unshielded MTJ sensor having a first unshielded sense layer with a first easy axis magnetic orientation, and a second unshielded MTJ sensor having a second unshielded sense layer with a second easy axis magnetic orientation, where the first and second easy axis magnetic orientations are deflected equally and in opposite directions from the pinning direction for the differential sensor circuit (e.g., at −45 degrees and 45 degrees, respectively).

In yet another form, there is provided a magnetic field sensor apparatus, method and associated fabrication process for forming a differential sensor circuit over a substrate which detects an applied magnetic field directed along a first axis. The differential sensor circuit may be constructed as a Wheatstone bridge structure of unshielded magnetic tunnel junction (MTJ) sensors formed with a plurality of pinned layers that are each magnetized in a single pinned direction and a corresponding plurality of unshielded sense layers. In an example implementation, the differential sensor circuit includes a first unshielded MTJ sensor having a first unshielded sense layer with a first easy axis magnetic orientation, and a second unshielded MTJ sensor having a second unshielded sense layer with a second easy axis magnetic orientation, where the first and second easy axis magnetic orientations are deflected equally and in opposite directions (e.g., ±45 degrees) from the single pinned direction. When each unshielded sense layer is formed to have an anisotropic axis with a longer length dimension and a shorter width dimension, the longer length dimension is aligned with an easy axis magnetic orientation for the unshielded sense layer. The magnetic field sensor may also include an embedded magnetic field generator for each unshielded sense layer that is positioned to generate a magnetic field pulse that is aligned with an easy axis magnetic orientation for each unshielded sense layer. In selected embodiments, the embedded magnetic field generator is implemented as a conductive line positioned to conduct a current pulse that creates a magnetic field pulse for resetting a magnetic orientation of an associated unshielded sense layer, and/or to apply a weak magnetic field along an easy axis magnetic orientation for each unshielded sense layer. The magnetic field sensor may also include a second differential sensor circuit formed over the substrate for detecting the applied magnetic field directed along a second axis that is orthogonal to the first axis. The second differential sensor circuit may be constructed as a Wheatstone bridge structure of unshielded magnetic tunnel junction (MTJ) sensors formed with a second plurality of pinned layers that are each magnetized in a second pinned direction and a corresponding plurality of unshielded sense layers, where the single pinned direction for the first differential sensor circuit is aligned with the first axis, and the second pinned direction for the second differential sensor circuit is aligned with the second axis. In an example implementation, the second differential sensor circuit includes a third unshielded MTJ sensor having a third unshielded sense layer with a third easy axis magnetic orientation, and a fourth unshielded MTJ sensor having a fourth unshielded sense layer with a fourth easy axis magnetic orientation, where the third and fourth easy axis magnetic orientations are deflected equally and in opposite directions from the second pinned direction for the second differential sensor circuit.

Although the described exemplary embodiments disclosed herein are directed to various sensor structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the relative positions of the sense and pinning layers in a sensor structure may be reversed so that the pinning layer is on top and the sense layer is below. Also the sense layers and the pinning layers may be formed with different materials than those disclosed. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A magnetic field sensor, comprising a differential sensor circuit formed over a substrate for detecting an applied magnetic field directed along a first axis, wherein the differential sensor circuit comprises a bridge structure of unshielded magnetic tunnel junction (MTJ) sensors formed with a plurality of pinned layers that are each magnetized in a single pinned direction and a corresponding plurality of unshielded sense layers, wherein the differential sensor circuit comprises:
   a first unshielded MTJ sensor having a first unshielded sense layer with a first easy axis magnetic orientation, and
   a second unshielded MTJ sensor having a second unshielded sense layer with a second easy axis magnetic orientation, where the first and second easy axis magnetic orientations are deflected equally and in opposite directions from the single pinned direction.

2. The magnetic field sensor of claim 1, wherein the first easy axis magnetic orientation is deflected about negative 45 degrees from the single pinned direction, and the second easy axis magnetic orientation is deflected about 45 degrees from the single pinned direction.

3. The magnetic field sensor of claim 1, wherein each unshielded sense layer comprises an anisotropic axis with a longer length dimension and a shorter width dimension, where the longer length dimension is aligned with an easy axis magnetic orientation for the unshielded sense layer.

4. The magnetic field sensor of claim 1, further comprising an embedded magnetic field generator for each unshielded sense layer that is positioned to generate a magnetic field pulse that is aligned with an easy axis magnetic orientation for each unshielded sense layer.

5. The magnetic field sensor of claim 4, wherein each embedded magnetic field generator comprises a conductive line positioned to conduct a current pulse that creates a magnetic field pulse for resetting a magnetic orientation of an associated unshielded sense layer.

6. The magnetic field sensor of claim 4, wherein each embedded magnetic field generator is configured to apply a weak magnetic field along an easy axis magnetic orientation for each unshielded sense layer.

7. The magnetic field sensor of claim 1, further comprising a second differential sensor circuit formed over the substrate for detecting the applied magnetic field directed along a second axis that is orthogonal to the first axis, wherein the second differential sensor circuit comprises a Wheatstone bridge structure of unshielded magnetic tunnel junction (MTJ) sensors formed with a second plurality of pinned layers that are each magnetized in a second pinned direction and a corresponding plurality of unshielded sense layers, where the single pinned direction for the first differential sensor circuit is orthogonal to the first axis, and the second pinned direction for the second differential sensor circuit is orthogonal to the second axis.

8. The magnetic field sensor of claim 7, wherein the second differential sensor circuit comprises:
 a third unshielded MTJ sensor having a third unshielded sense layer with a third easy axis magnetic orientation, and
 a fourth unshielded MTJ sensor having a fourth unshielded sense layer with a fourth easy axis magnetic orientation,
 where the third and fourth easy axis magnetic orientations are deflected equally and in opposite directions from the second pinned direction for the second differential sensor circuit.

\* \* \* \* \*